US010551884B1

(12) United States Patent
Chou et al.

(10) Patent No.: US 10,551,884 B1
(45) Date of Patent: Feb. 4, 2020

(54) ATX SPECIFICATION POWER SUPPLY COMPRISING A REDUNDANT POWER SUPPLY ARCHITECTURE

(71) Applicant: SEA SONIC ELECTRONICS CO., LTD., Taipei (TW)

(72) Inventors: Sheng-Chien Chou, Taipei (TW); Kuan-Pao Lee, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 16/390,994

(22) Filed: Apr. 22, 2019

(51) Int. Cl.
  *H05K 7/14* (2006.01)
  *G06F 1/18* (2006.01)
(52) U.S. Cl.
  CPC ........... *G06F 1/189* (2013.01); *H05K 7/1432* (2013.01); *H05K 7/1457* (2013.01)
(58) Field of Classification Search
  None
  See application file for complete search history.

(56) References Cited

U.S. PATENT DOCUMENTS

| | | | | |
|---|---|---|---|---|
| 6,014,319 A * | 1/2000 | Kuchta | ................. | G06F 1/184 361/788 |
| 6,038,126 A * | 3/2000 | Weng | .................... | G06F 1/189 312/223.2 |
| 6,198,633 B1 * | 3/2001 | Lehman | ................... | G06F 1/18 312/332.1 |
| 6,219,249 B1 * | 4/2001 | Tuccio | ................... | H05K 7/183 312/223.2 |
| 6,325,636 B1 * | 12/2001 | Hipp | ....................... | G06F 1/183 361/788 |
| 8,189,340 B2 * | 5/2012 | Howard | ............... | H05K 7/1422 361/730 |
| 8,320,107 B2 * | 11/2012 | Coffey | ..................... | H02B 1/04 174/51 |
| 9,295,169 B1 * | 3/2016 | Spinner | ............ | G01R 31/31907 |
| 2011/0261526 A1 * | 10/2011 | Atkins | .................... | G06F 1/187 361/679.33 |
| 2013/0120941 A1 * | 5/2013 | Peterson | .............. | H05K 7/1492 361/724 |
| 2017/0108903 A1 * | 4/2017 | Che | ........................... | G05B 9/02 |
| 2017/0139451 A1 * | 5/2017 | Chuang | ................... | G06F 1/181 |
| 2019/0056770 A1 * | 2/2019 | Lin | .......................... | G06F 1/20 |

* cited by examiner

*Primary Examiner* — Courtney L Smith
(74) *Attorney, Agent, or Firm* — Muncy, Geissler, Olds & Lowe, P.C.

(57) ABSTRACT

The present invention provides an ATX specification power supply comprising redundant power supply architecture. A casing where the ATX specification power supply is located includes an ATX specification housing and a frame provided in the ATX specification housing. The frame is defined with a plurality of power module assembly regions and a modulation module assembly region in the ATX specification housing. The power module assembly regions are for a plurality of power modules to be provided therein, and the modulation module assembly region is for a power modulation module to be provided therein. The plurality of power modules and the power modulation module are further connected to a power integration backplate provided in the ATX specification housing, enabling the ATX specification power supply to construct redundant power supply architecture.

10 Claims, 5 Drawing Sheets

ATX SPECIFICATION POWER SUPPLY COMPRISING A REDUNDANT POWER SUPPLY ARCHITECTURE

FIELD OF THE INVENTION

The present invention relates to an ATX specification power supply, and particularly to a computer power supply comprising a redundant power supply architecture constructed in an ATX specification housing.

BACKGROUND OF THE INVENTION

In a computer power supply implemented according to the ATX specification, there exists an issue of data loss or even hard drive damage caused by inaccessibility to reserve power for a computer, once damage occurs during utilization of the computer power supply. Therefore, manufacturers have proposed a backup power supply implemented according to an ATX casing specification, and a patent related to the casing thereof can be referred from the disclosure of US 2017/0139451 A1. The casing uses a plurality of separation plates provided and a plurality of guide plates in a first body to define a space for installing two backup power supplies. However, during the installation process of the separation plates and the guide plates, these components need to be accurately aligned, and any slight deviation can disfavor the configuration of the two backup power supplies. In addition, the structure disclosed by the above patent is complicated.

From another perspective, the above backup power supply includes only two backup power supplies capable of performing plugging and plugging, and a power management bus circuit board of the backup power supply is provided in a fixed form in the casing, such that the power management bus cannot be easily replaced nor can it be upgraded according to user requirements.

SUMMARY OF THE INVENTION

It is a primary object of the present invention to solve application issues caused by a conventional structure.

To achieve the above issue, the present invention provides an ATX specification power supply comprising a redundant power supply architecture. The ATX specification power supply includes a casing, a plurality of power modules, a power modulation module and a power integration backplate. The casing comprises an ATX specification housing and a frame provided in the ATX specification housing. The ATX specification housing is hollow and comprises an installation entrance and at least one opening formed thereon. The frame includes a frame body surrounding an installation space, a plurality of first separation plates provided at the frame body and located in the installation space, and two second separation plates provided in a spaced manner outside the frame body to define a modulation module assembly region. The plurality of first separation plates define the installation space into a plurality of power module assembly regions. The plurality of power modules are respectively provided in the power module assembly regions via the installation entrance, and each of the plurality of power modules is able to be inserted into or removed from the casing separately. The power modulation module is provided in the modulation module assembly region via the installation entrance, and the power modulation module is able to be inserted into or removed from the casing separately. The power integration backplate is provided corresponding to the opening in the ATX specification housing, and includes a plurality of first connection ports respectively connected to the plurality of power modules, a second connection port connected to the power modulation module, and a plurality of power output ports facing the opening.

In one embodiment, the casing includes a bearing rack provided in the ATX specification housing and connected to the frame.

In one embodiment, the bearing rack includes a carrier plate to be provided for the frame, at least two support plates provided on edges of the carrier plate, and at least two installation plates respectively provided corresponding to the support plates, as well as parallel to the carrier plate and connected to the ATX specification housing.

In one embodiment, the bearing rack includes a plurality of blocking pieces provided at coupling positions between the carrier plate, and the plurality of blocking pieces extend along edges of the frame and jointly limit the frame.

In one embodiment, the bearing rack includes at least one auxiliary support plate provided on one side of the carrier plate opposing to the frame.

In one embodiment, the ATX specification housing is formed by a first shell and a second shell. The first shell includes a lower plate, a first panel connected to the lower plate and provided with the installation entrance, and two side plates respectively connected to the lower plate and the first panel. The second shell includes an upper plate, and a second panel connected to the upper plate and comprising the opening formed thereon. The lower plate and the upper plate are arranged in parallel, and the first panel and the second panel are arranged in parallel.

In one embodiment, the first shell includes an auxiliary connecting plate connected the first panel and the second panel and located on the same horizontal level as the upper plate.

In one embodiment, the first panel comprises a plurality of computer case installation holes.

In one embodiment, the frame includes a plurality of stopping structures located on one side of the frame body facing the power integration backplate and respectively provided corresponding to the plurality of power module assembly regions.

In one embodiment, each of the plurality of power modules and the power modulation module respectively includes an encasement, and the specification of the encasement of each of the plurality of power modules is 1 U.

With the foregoing implementation of the present invention, the present invention provides the following features compared to the prior art. In the present invention, with the redundant power supply architecture constructed in the ATX specification housing, in addition to increasing the power density of the ATX specification power supply, the power supply stability of the ATX specification power supply is enhanced. Further, in the present invention, the power module assembly regions and the modulation module assembly region are defined by the frame, and thus the structure needed for implementation is significantly simplified. Moreover, since the power modulation module of the present invention is implemented in a modularized form instead of being fixedly provided in the ATX specification housing, a user can replace or update the power modulation module according to implementation requirements, thereby improving the expansion capability and compatibility of the ATX specification power supply.

DETAILED DESCRIPTION OF THE PREFERRED EMBODIMENTS

Details and technical contents of the present invention are given with the accompanying drawings below.

Figure 1:
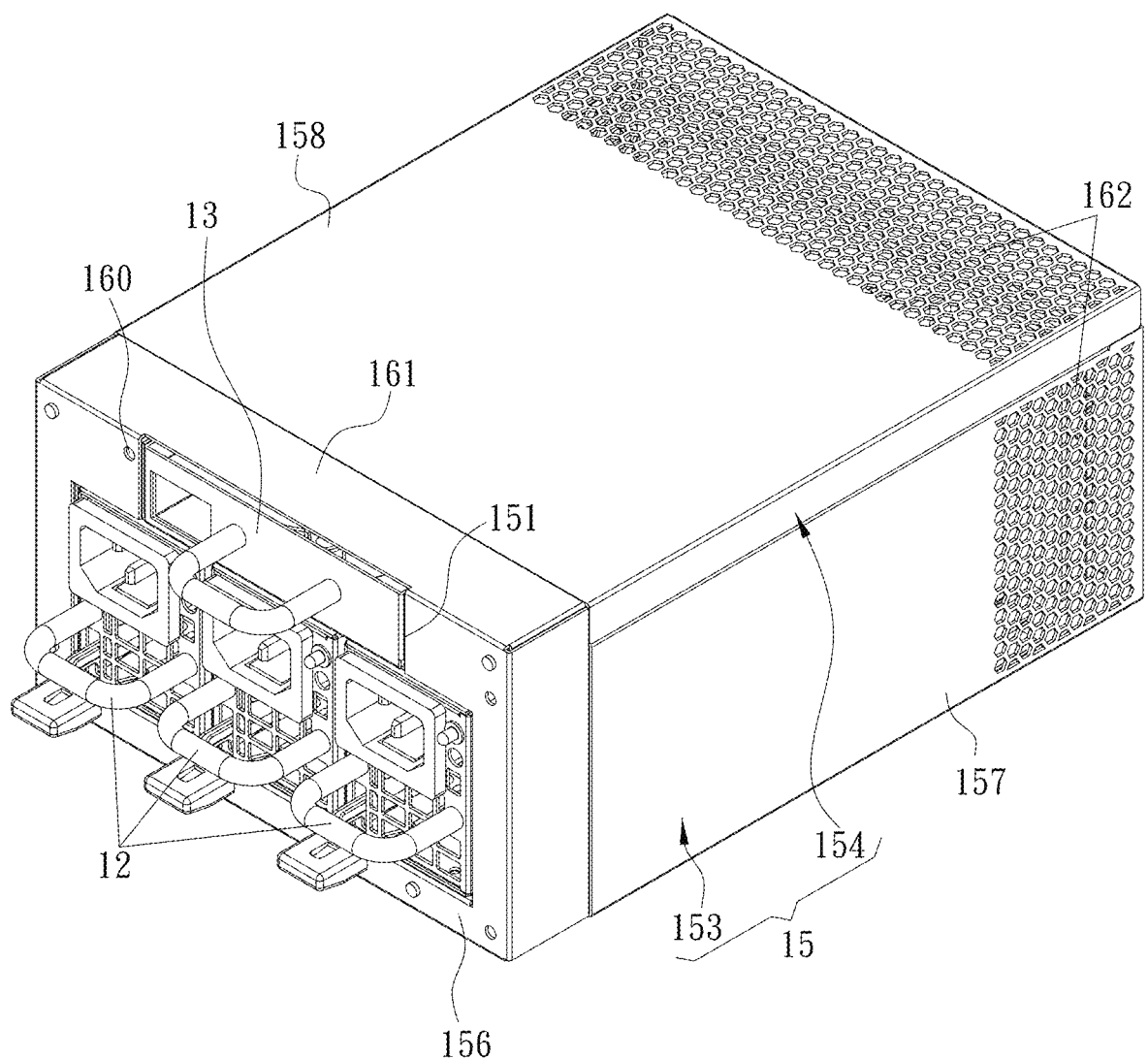
FIG. 1 is a schematic diagram of a structure according to an embodiment of the present invention.
Figure 2:
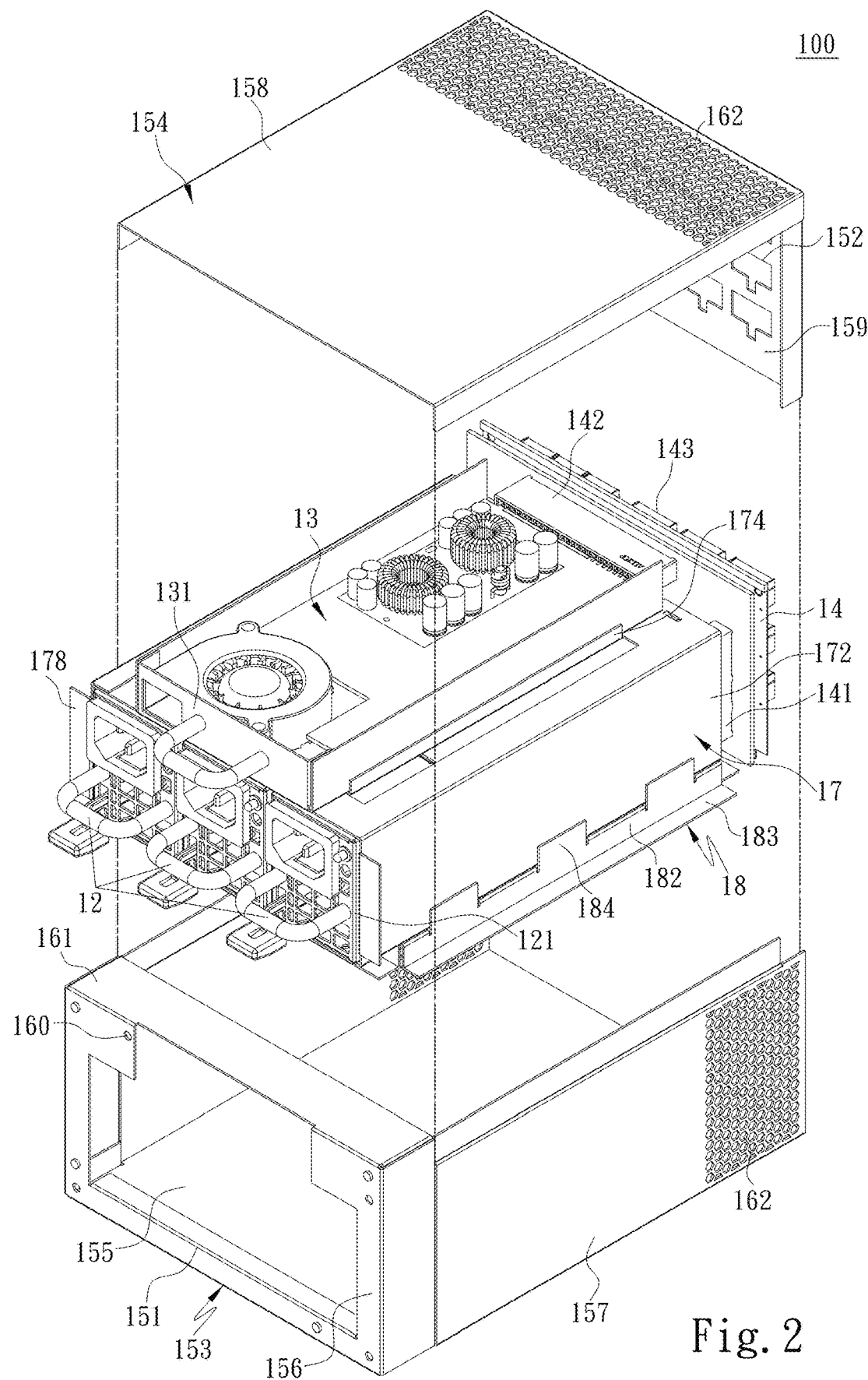
FIG. 2 is an exploded schematic diagram of a partial structure according to an embodiment of the present invention.
Figure 3:
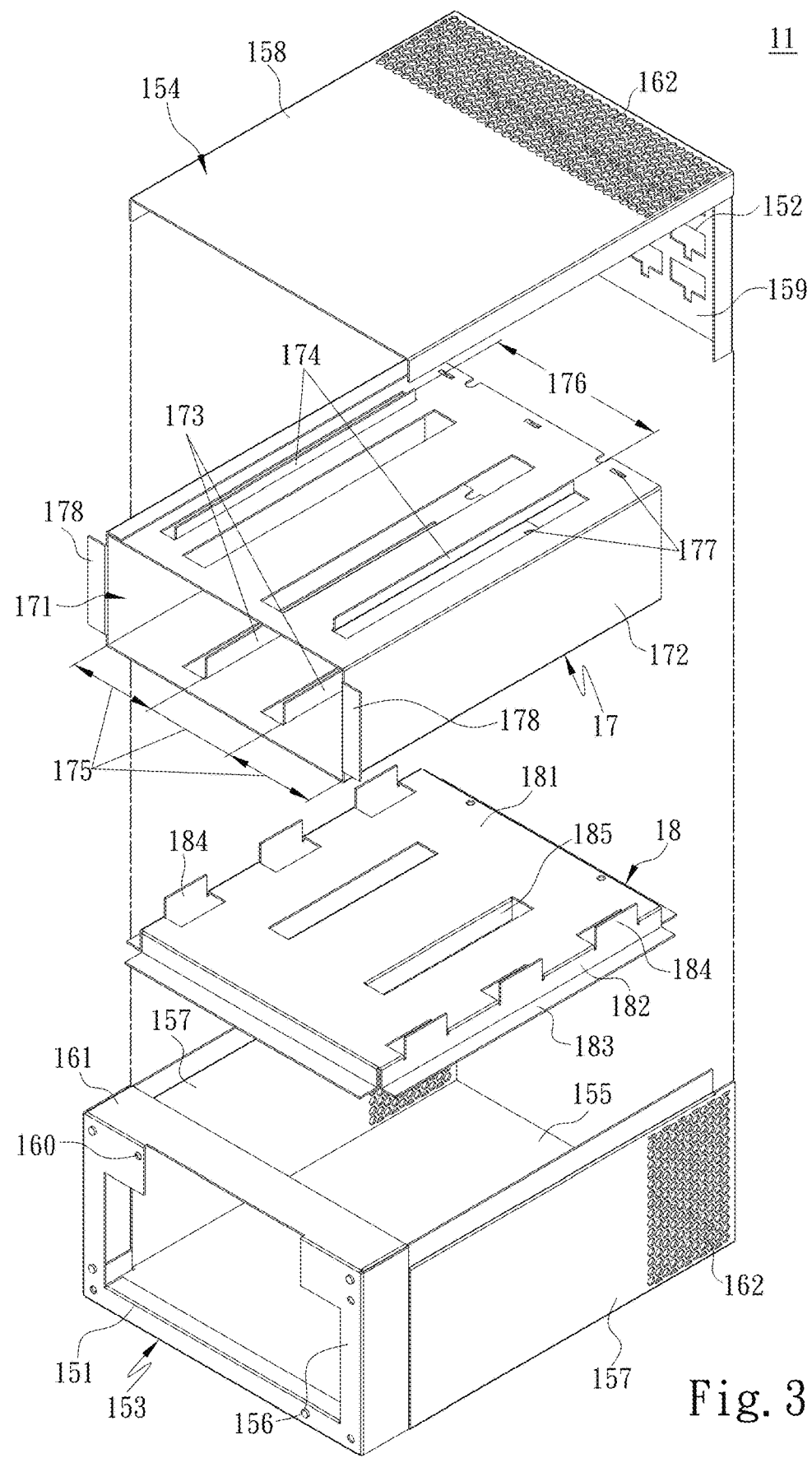
FIG. 3 is an exploded schematic diagram of a casing structure according to an embodiment of the present invention.

Referring to FIGS. 1, 2 and 3, the present invention provides an ATX specification power supply 100 comprising a redundant power supply architecture. An overall size of the ATX specification power supply 100 conforms to an ATX specification size and can be configured on a computer case (not shown). Further, the ATX specification power supply 100 includes a casing 11, a plurality of power modules 12 provided in the casing 11, a power modulation module 13 provided in the casing 11, and a power integration backplate 14 provided in the casing 11. Referring to FIGS. 1, 2, 3 and 4, the casing 11 includes an ATX specification housing 15 and a frame 17 provided in the ATX specification housing 15. The ATX specification housing 15 comprises a length of 190 mm, a width of 150 mm, and a height of 86 mm. Further, the ATX specification housing 15 is hollow to comprise an installation entrance 151 and at least one opening 152 formed therein, wherein the installation entrance 151 and the opening 152 are respectively located on two opposite sides of the ATX specification housing 15. In implementation, the installation entrance 151 faces the outside of the computer case, and the opening 152 is located in the computer case to face electronic components in the computer case. Further, the opening 152 of the present invention can be implemented in a single or plural quantity. Further, in one embodiment, the ATX specification housing 15 is composed of a first shell 153 and a second shell 154. The first shell 153 and the second shell 154 are respectively manufactured by at least one metal plate material to be processed by machining procedures such as stamping. The first shell 153 includes a lower plate 155, a first panel 156 connected to the lower plate 155 and provided with the installation entrance 151, and two side plates 157 respectively connected to the lower plate 155 and the first panel 156. The second shell 154 includes an upper plate 158, and a second panel 159 connected to the upper plate 158 and provided with the opening 152. The lower plate 155 and the upper plate 158 are arranged in parallel, the first panel 156 and the second panel 159 are arranged in parallel. Further, in order to assemble the ATX specification housing 15 in the computer case, the first panel 156 is provided with a plurality of computer case installation holes 160 which are distributed on the first panel 156 instead of being disposed at one single position on the first panel 156. Accordingly, in order to reinforce the structural strength of the first shell 153, in one embodiment, the first shell 153 further includes an auxiliary connecting plate 161 connected to the first panel 156 as well as the two side plates 157 and located on the same horizontal level as the upper plate 158. In the embodiment, a total area of the auxiliary connecting plate 161 and the upper plate 158 is equal to the area of the lower plate 155. Moreover, the ATX specification housing 15 of the present invention further includes a plurality of ventilation holes 162 formed at one end corresponding to the opening 152, so as to facilitate heat dissipation by using the plurality of ventilation holes 162.

Figure 4:
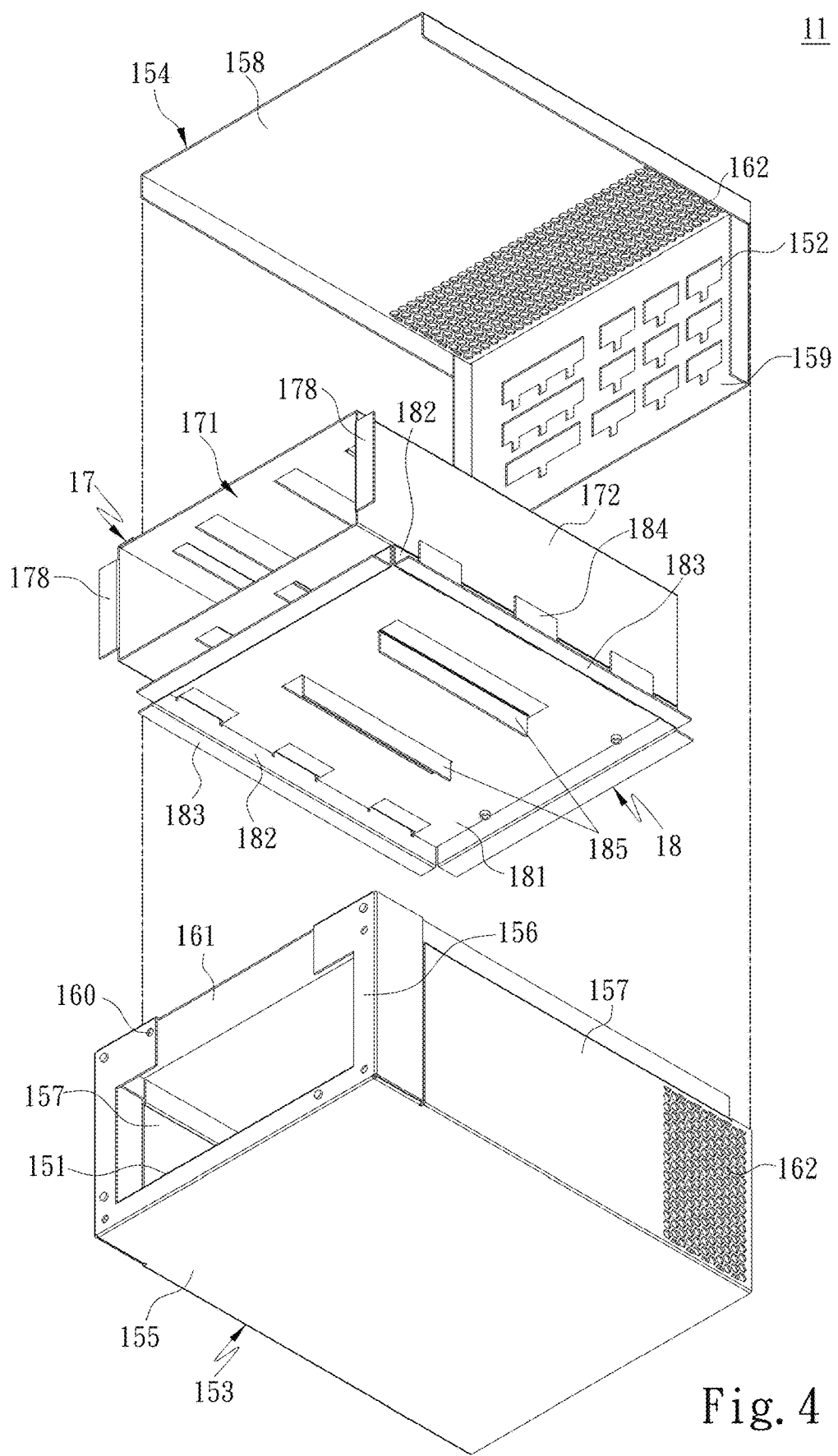
FIG. 4 is an exploded schematic diagram of a casing structure from another direction according to an embodiment of the present invention.

Referring to FIGS. 2, 3 and 4, the frame 17 of the present invention is provided in the ATX specification housing 15, which includes a frame body 172 surrounding an installation space 171, a plurality of first separation plates 173 located at the frame body 172 in the installation space 171, and two second separation plates 174 arranged in a spaced manner outside the frame body 172. One end opening of the frame body 172 faces the installation entrance 151, and a size of the installation space 171 that at least meets a size to install the plurality of power modules 12 in the installation space 171. Taking the embodiment depicted in FIG. 2 for instance, the size of the installation space 171 is equal to the total size of three of the power modules 12. On the other hand, the present invention allows the plurality of first separation plates 173 to arrange in a spaced manner and define a plurality of power module assembly regions 175, the plurality of power module assembly regions 175 evenly divide the volume in the installation space 171. In one embodiment, the plurality of first separation plates 173 is individually formed from a segment of the frame body 172 generated by stamping. Further, a height of the first separation plates 173 is equal to a height of the installation space 171, or reaches a height that at least limit displacement of the plurality of power modules 12. In addition, the present invention provides the two second separation plates 174 to define a modulation module assembly region 176. In this embodiment, the modulation module assembly region 176 is located on one side of the frame body 172 facing the upper plate 158, and the modulation module assembly region 176 is designed according to the size of the power modulation module 13. Moreover, the two second separation plates 174 can also be formed from another one segment of the frame body 172 generated by stamping. In addition, in one embodiment, the frame 17 further includes two wings 178 formed on one side of the frame body 172 facing the installation entrance 151, and the two wings 178 respectively extend towards the two side plates 157, so as to be used for locating the position of the frame 17 disposed inside the ATX specification housing 15. The frame 17 further includes a plurality of stopping structures 177 located on one side of the frame body 172 facing the power integration backplate 14 and respectively disposed corresponding to the plurality of power module assembly regions 175, wherein each of the stopping structures 177 can be a protrusion block or a projecting piece. The plurality of stopping structures 177 fix the position of the power modules 12 while the plurality of power modules 12 are respectively placed in the plurality of power module assembly regions 175.

Referring to FIGS. 2, 3 and 4 again. In one embodiment, the casing 11 further includes a bearing rack 18 provided in the ATX specification housing 15. The bearing rack 18 is connected to the frame 17, so as to support the frame 17 in the ATX specification housing 15. In the embodiment, by disposal of the bearing rack 18, the frame 17 is able to be fixed in the ATX specification housing 15 without other connecting mechanisms, thus simplifying the overall structure. Accordingly, the bearing rack 18 of the present invention includes a carrier plate 181 for disposal of the frame 17, at least two support plates 182 provided on the edges of the carrier plate 181, and at least two installation plates 183 respectively provided corresponding to the at least two support plates 182 as well as parallel to the carrier plate 181 so as to connect with the ATX specification housing 15.

Further, the carrier plate 181, the two support plates 182 and the two installation plates 183 can be integrally formed from the bearing rack 18 by stamping a metal plate and other such machining processes. Further, the two support plates 182 are respectively provided on two opposite sides of the carrier plate 181. In one embodiment, the bearing rack 18 is provided with the support plates 182 on each of four sides of the carrier plate 181, as shown in FIG. 4. Accordingly, in order to allow the frame 17 to be steadily fixed on the bearing rack 18, in one embodiment, the bearing rack 18 includes a plurality of blocking pieces 184 respectively provided at coupling positions between the carrier plate 181 and the support plates 182, wherein the plurality of blocking pieces 184 are parallel to the two side plates 157 and extend along edges of the frame 17. In the embodiment, the plurality of blocking pieces 184 jointly limit the position of the frame 17, and a height of the plurality of blocking pieces 184 needs to reach a height that at least limit the frame 17. Further, the plurality of blocking pieces 184 are able to be formed from a segment of the bearing rack 18 generated by stamping. In addition to the above, in one embodiment, the bearing rack 18 further includes an auxiliary support plate 185 provided on one side of the carrier plate 181 opposing to the frame 17. The auxiliary support plate 185 and the carrier plate 181 comprise an included angle therebetween, that is, the auxiliary support plate 185 is not parallel to the carrier plate 181. The auxiliary support plate 185 and the support plates 182 jointly share the weight of the frame 17 and a plurality of components installed on the frame 17. Further, the auxiliary support plate 185 is implemented in a plural quantity, the auxiliary support plate 185 are arranged in a spaced manner upon implementing in a plural quantity, so as to evenly share the weight. Further, regardless of the auxiliary support plate 185 is implemented in a single or plural quantity, the auxiliary support plate 185 is formed from another one segment of the bearing rack 18 generated by stamping.

Figure 5:
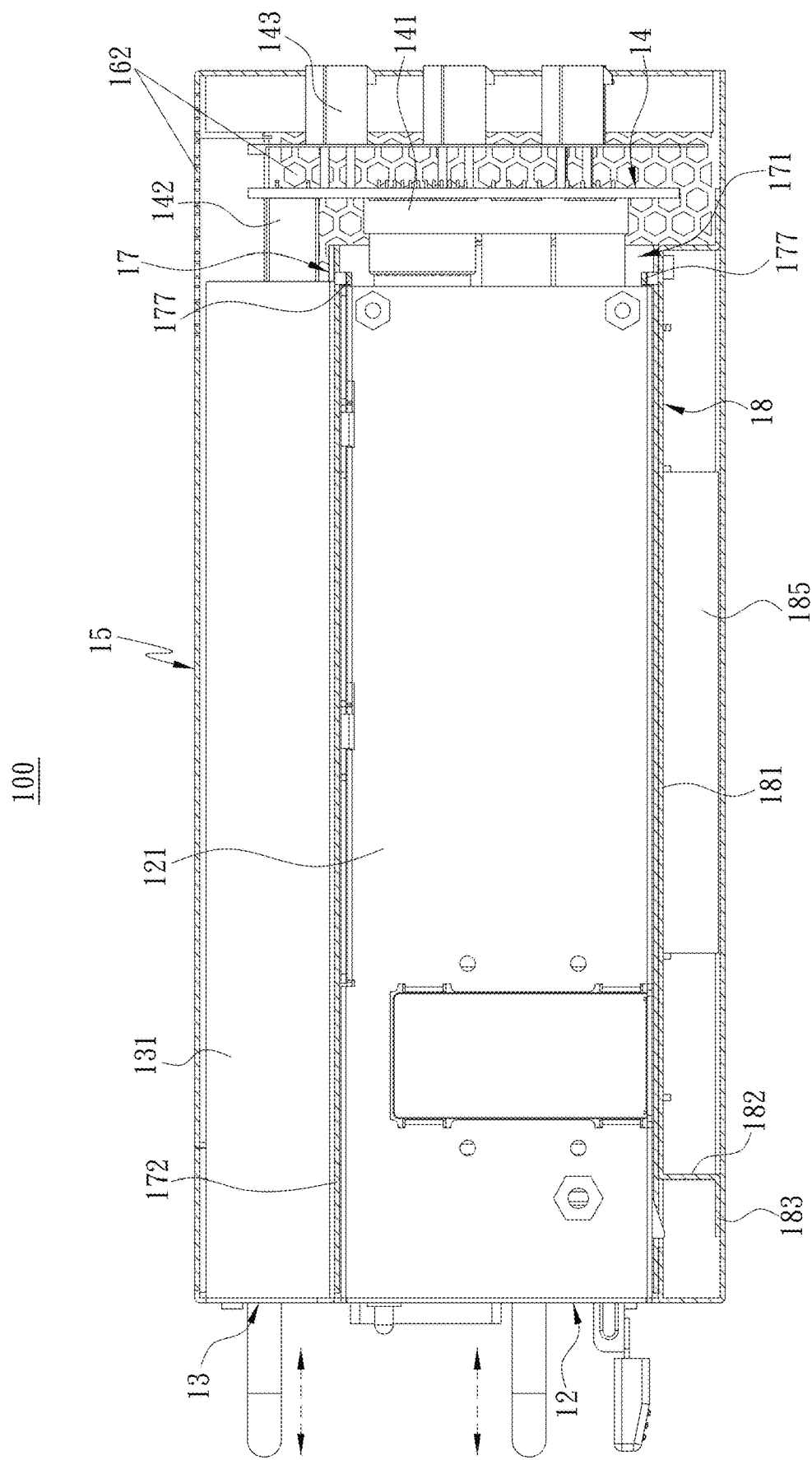
FIG. 5 is a section schematic diagram of a structure according to an embodiment of the present invention.

Referring to FIGS. 1, 2 and 5, each of the plurality of power modules 12 and the power modulation module 13 of the present invention respectively include an encasement 121 and 131. The specification of the encasement 121 of each of the plurality of power modules 12 is 1 U. Further, the plurality of power modules 12 are respectively provided in the plurality of power module assembly regions 175 via the installation entrance 151. Each of the plurality of power modules 12 operates independently and each of the plurality of power modules 12 is able to be inserted into or removed from the casing 11 separately. Details of inserting and removing the power module can be referred from current associated technologies of redundant power supplies and are omitted herein. On the other hand, the power modulation module 13 is provided in the modulation module assembly region 176 via the installation entrance 151, and the power modulation module 13 is able to be inserted into or removed from the casing 11 individually. The power modulation module 13 provides functions of power management in addition to power conversion. The power integration backplate 14 is provided corresponding to the opening 152 in the ATX specification housing 15, wherein the power integration backplate 14 includes a plurality of first connection ports 141 respectively connected to the plurality of power modules 12, a second connection port 142 connected to the power modulation module 13, and a plurality of power output ports 143 facing the opening 152.

Accordingly, the present invention provides the plurality of power modules 12, the power modulation module 13 and the power integration backplate 14 to construct redundant power architecture in the ATX specification housing 15. In implementation, the plurality of power modules 12 respectively output power to the power integration backplate 14 after being activated. The power integration backplate 14 directly provides the power to an external electronic device through the plurality of power output ports 143, and also transmits the power to the power modulation module 13, such that the power is converted by the power modulation module 13 and then outputted to the power integration backplate 14. The power integration backplate 14 then provides the power outputted from the power modulation module 13 to the external electronic device.

In the present invention, the plurality of power modules 12 are constructed into an (N+1) power supply structure, and thus the ATX specification power supply 100 does not stop outputting power in the event of damage of one of the plurality of power modules 12, thereby significantly enhancing the power supply stability. Further, the redundant power supply architecture constructed in the ATX specification housing 15, the power density of the ATX specification power supply 100 is increased. Moreover, the power modulation module 13 of the present invention is implemented in a modularized form instead of being fixedly provided in the ATX specification housing 15, so as to allow a user replacing or updating the power modulation module 13 according to implementation demands. Accordingly, the expansion capability and compatibility of the ATX specification power supply 100 disclosed by the present invention can be improved.

What is claimed is:

1. An ATX specification power supply comprising redundant power supply architecture, including:
    a casing, comprising an ATX specification housing and a frame provided in the ATX specification housing, the ATX specification housing being hollow to comprise an installation entrance and at least one opening formed therein, the frame comprising a frame body surrounding an installation space, a plurality of first separation plates provided at the frame body and located in the installation space, and two second separation plates provided in a spaced manner outside the frame body to define a modulation module assembly region, the plurality of first separation plates defining the installation space into a plurality of power module assembly regions;
    a plurality of power modules, respectively provided in the plurality of power module assembly regions via the installation entrance, each of the plurality of power modules being separately inserted into or removed from the casing;
    a power modulation module, provided in the modulation module assembly region via the installation entrance, and being inserted into or removed from the casing; and
    a power integration backplate, provided corresponding to the opening in the ATX specification housing, comprising a plurality of first connection ports respectively connected to the plurality of power modules, a second connection port connected to the power modulation module, and a plurality of power output ports facing the opening.

2. The ATX specification power supply according to claim 1, wherein the casing comprises a bearing rack provided in the ATX specification housing and connected to the frame.

3. The ATX specification power supply according to claim 2, wherein the bearing rack comprises a carrier plate to be provided for the frame, at least two support plates provided on edges of the carrier plate, and at least two installation plates respectively provided corresponding to the support plates as well as parallel to the carrier plate and connected to the ATX specification housing.

4. The ATX specification power supply according to claim 3, wherein the bearing rack comprises a plurality of blocking pieces respectively provided at coupling positions between the carrier plate and the support plates, the plurality of blocking pieces extend along edges of the frame and jointly limit the frame.

5. The ATX specification power supply according to claim 3, wherein the bearing rack comprises at least one auxiliary support plate provided on one side of the carrier plate opposing to the frame.

6. The ATX specification power supply according to claim 1, wherein the ATX specification housing is composed of a first shell and a second shell, the first shell comprises a lower plate, a first panel connected to the lower plate and provided with the installation entrance, and two side plates respectively connected to the lower plate and the first panel, the second shell comprises an upper plate and a second panel provided with the opening, the lower plate and the upper plate are arranged in parallel, and the first panel and the second panel are arranged in parallel.

7. The ATX specification power supply according to claim 6, wherein the first shell comprises an auxiliary connecting plate connected to the first panel and the two side plates and located on a same horizontal level as the upper plate.

8. The ATX specification power supply according to claim 6, wherein the first panel comprises a plurality of computer case installation holes.

9. The ATX specification power supply according to claim 1, wherein the frame comprises a plurality of stopping structures located on one side of the frame body facing the power integration backplate and respectively provided corresponding to the plurality of power module assembly regions.

10. The ATX specification power supply according to claim 1, wherein each of the plurality of power modules and the power modulation module respectively comprises an encasement, and a specification of the encasement of each of the plurality of power modules is 1 U.

* * * * *